United States Patent
Ouyang et al.

(10) Patent No.: US 7,756,004 B2
(45) Date of Patent: *Jul. 13, 2010

(54) INTERLEAVER DESIGN WITH COLUMN SWAP AND BIT CIRCULATION FOR MULTIPLE CONVOLUTIONAL ENCODER MIMO OFDM SYSTEM

(75) Inventors: Xuemei Ouyang, San Jose, CA (US); Chiu Ngo, San Francisco, CA (US)

(73) Assignee: Samsung Electronics Co., Ltd., Suwon (KR)

(*) Notice: Subject to any disclaimer, the term of this patent is extended or adjusted under 35 U.S.C. 154(b) by 737 days.

This patent is subject to a terminal disclaimer.

(21) Appl. No.: 11/314,925

(22) Filed: Dec. 20, 2005

(65) Prior Publication Data

US 2007/0140103 A1    Jun. 21, 2007

(51) Int. Cl.
*H04J 11/00* (2006.01)
(52) U.S. Cl. .................... 370/208; 375/260
(58) Field of Classification Search ......... 370/203–208, 370/310, 328, 338; 375/260–268, 340, 343
See application file for complete search history.

(56) References Cited

U.S. PATENT DOCUMENTS

| | | | |
|---|---|---|---|
| 4,394,642 A | 7/1983 | Currie et al. | |
| 5,745,528 A | 4/1998 | Fimoff et al. | |
| 5,987,070 A | 11/1999 | Fimoff et al. | |
| 6,775,335 B2 | 8/2004 | Sommer et al. | |
| 6,901,550 B2 | 5/2005 | Adar et al. | |
| 6,961,388 B2 | 11/2005 | Ling et al. | |
| 7,010,053 B2 | 3/2006 | El-Gamal et al. | |
| 7,127,658 B2 | 10/2006 | Cucchi et al. | |
| 7,154,936 B2 | 12/2006 | Bjerke et al. | |
| 7,284,185 B2 | 10/2007 | Chen | |
| 7,366,249 B2 | 4/2008 | Gresset et al. | |
| 7,397,862 B2 * | 7/2008 | Ouyang et al. | 375/267 |
| 7,523,377 B2 | 4/2009 | Halter | |
| 7,542,410 B2 | 6/2009 | Berkovich | |
| 2005/0220110 A1 * | 10/2005 | Agarwal | 370/392 |
| 2005/0256821 A1 | 11/2005 | Mishra et al. | |
| 2005/0265469 A1 * | 12/2005 | Aldana et al. | 375/260 |
| 2005/0283705 A1 | 12/2005 | McNamara | |
| 2006/0002486 A1 | 1/2006 | van Nee | |
| 2006/0013330 A1 | 1/2006 | Ha | |
| 2006/0036924 A1 | 2/2006 | Ghosh | |

(Continued)

OTHER PUBLICATIONS

S.A. Mujtaba, "TGn Sync Proposal Technical Specification," doc.: IEEE 802.11 11-04/889r2, Jan. 2005, pp. 1-152.

(Continued)

*Primary Examiner*—Ricky Ngo
*Assistant Examiner*—Kan Yuen
(74) *Attorney, Agent, or Firm*—Kenneth L. Sherman, Esq.; Michael Zarrabian, Esq.; Myers Andras Sherman LLP

(57) ABSTRACT

An improved interleaver design to fully explore the diversity of the MIMO OFDM systems provides higher diversity gain than usual. A method for wireless data communication using such interleaver design implements parsing a bit stream into multiple spatial data streams, interleaving the bits in each spatial data stream by performing bit circulation and column swapping to increase diversity of the wireless system, and transmitting the bits of each spatial data stream.

13 Claims, 6 Drawing Sheets

U.S. PATENT DOCUMENTS

| | | | |
|---|---|---|---|
| 2006/0088114 A1* | 4/2006 | Chen et al. | 375/260 |
| 2006/0088115 A1* | 4/2006 | Chen et al. | 375/260 |
| 2006/0093059 A1* | 5/2006 | Skraparlis | 375/267 |
| 2006/0107171 A1 | 5/2006 | Skraparlis | |
| 2006/0120469 A1 | 6/2006 | Maltsev et al. | |
| 2006/0187815 A1* | 8/2006 | Wallace et al. | 370/203 |
| 2006/0227892 A1 | 10/2006 | Ouyang et al. | |
| 2006/0274687 A1 | 12/2006 | Kim | |
| 2007/0067696 A1* | 3/2007 | Bhatt et al. | 714/758 |
| 2007/0086538 A1* | 4/2007 | Ouyang et al. | 375/267 |
| 2007/0110178 A1 | 5/2007 | Su et al. | |
| 2007/0127587 A1* | 6/2007 | Ouyang et al. | 375/267 |
| 2007/0140100 A1* | 6/2007 | Ouyang et al. | 370/203 |
| 2007/0140364 A1 | 6/2007 | Ouyang et al. | |
| 2007/0147521 A1 | 6/2007 | Horng et al. | |

OTHER PUBLICATIONS

S.A. Mujtaba, "TGn Sync Proposal Technical Specification," doc.: IEEE 802.11-04/889r0, Aug. 2004, pp. 1-135.

M.K. Abdul Aziz and A.R. Nix, "A Study of Performance and Complexity for IEEE 802.11n MIMO-OFDM GIS Solutions," IEEE Communications Society, International Conference, New York, 2004, vol. 7, pp. 3822-3826.

S.A. Mujtaba, "TGn Sync Proposal Technical Specification," doc.: IEEE 802.11-04/889r1, Nov. 2004, pp. 1-143.

Singh, et al., "WWiSE Proposal: High throughput extension to the 802.11 Standard," doc.: IEEE 802.11-04/0886r4, Nov. 2004, pp. 1-80.

Kose, et al., "WWiSE Proposal: High throughput extension to the 802.11 Standard," doc.: IEEE 802.11-05/0149r2, Mar. 2005, pp. 1-93.

S.A. Mujtaba, "TGn Sync Proposal Technical Specification," doc.: IEEE 802.11-04/0889r7, Jul. 2005, pp. 1-133.

Naguib, et al., "Inceasing Date Rate Over Wireless Channels," Signal Processing Magazine, IEEE, May 2000, pp. 76-92.

S.A. Mujtaba, "TGn Sync Proposal Technical Specification," doc.: IEEE 802.11-04/0889r4, Mar. 2005, pp. 1-162.

International Search Report for International Application No. PCT/KR2006/005555 from Korean Intellectual Property Office dated Mar. 20, 2007, 3 pgs.

Written Opinion of the International Search Authority for International Application No. PCT/KR2006/005555 from Korean Intellectual Property Office dated Mar. 20, 2007, 4 pgs.

International Search Report for International Application No. PCT/KR2006/005133 from Korean Intellectual Property Office dated Feb. 26, 2007, 3 pgs.

Written Opinion of the International Searching Authority for International Application No. PCT/KR2006/005133 from Korean Intellectual Property Office dated Feb. 26, 2007, 3 pgs.

U.S. Non-Final Office Action for U.S. Appl. No. 11/104,808 mailed on Jan. 24, 2008.

U.S. Non-Final Office Action for U.S. Appl. No. 11/104,808 mailed on Jul. 21, 2008.

U.S. Final Office Action for U.S. Appl. No. 11/104,808 mailed on Jan. 6, 2009.

U.S. Advisory Action for U.S. Appl. No. 11/104,808 mailed on Apr. 6, 2009.

U.S. Non-Final Office Action for U.S. Appl. No. 11/314,929 mailed on Oct. 10, 2008.

U.S. Final Office Action for U.S. Appl. No. 11/314,929 mailed on Apr. 3, 2009.

U.S. Notice of Allowance for U.S. Appl. No. 11/253,855 mailed on Mar. 4, 2008.

U.S. Notice of Allowance for U.S. Appl. No. 11/104,808 mailed on Jul. 6, 2009.

U.S. Final Office Action for U.S. Appl. No. 11/292,851 mailed on Mar. 31, 2009.

U.S. Non-Final Office Action for U.S. Appl. No. 11/292,851 mailed on Oct. 16, 2008.

U.S. Non-Final Office Action for U.S. Appl. No. 11/292,851 mailed on Aug. 20, 2009.

U.S. Notice of Allowance for U.S. Appl. No. 11/314,929 mailed on Oct. 8, 2009.

U.S. Final Office Action for U.S. Appl. No. 11/317,409 mailed on May 1, 2009.

U.S. Non-Final Office Action for U.S. Appl. No. 11/317,409 mailed on Nov. 13, 2008.

U.S. Non-Final Office Action for U.S. Appl. No. 11/317,409 mailed on Aug. 11, 2009.

* cited by examiner

INTERLEAVER DESIGN WITH COLUMN SWAP AND BIT CIRCULATION FOR MULTIPLE CONVOLUTIONAL ENCODER MIMO OFDM SYSTEM

FIELD OF THE INVENTION

The present invention relates generally to data communication, and more particularly, to data communication with transmission diversity using Multiple Input Multiple Output (MIMO) Orthogonal Frequency Division Multiplexing (OFDM) in multiple antenna channels.

BACKGROUND OF THE INVENTION

In wireless communication systems, antenna diversity plays an important role in increasing the system link robustness. OFDM is used as a modulation technique for transmitting digital data using radio frequency signals (RF). In OFDM, a radio signal is divided into multiple sub-signals that are transmitted simultaneously at different frequencies to a receiver. Each sub-signal travels within its own unique frequency range (sub-channel), which is modulated by the data. OFDM distributes the data over multiple channels, spaced apart at different frequencies.

OFDM modulation is typically performed using a transform such as Fast Fourier Transform (FFT) process wherein bits of data are encoded in the frequency-domain onto sub-channels. As such, in the transmitter, an Inverse FFT (IFFT) is performed on the set of frequency channels to generate a time-domain OFDM symbol for transmission over a communication channel. The IFFT process converts the frequency-domain phase and amplitude data for each sub-channel into a block of time-domain samples which are converted to an analogue modulating signal for an RF modulator. In the receiver, the OFDM signals are processed by performing an FFT process on each symbol to convert the time-domain data into frequency-domain data, and the data is then decoded by examining the phase and amplitude of the sub-channels. Therefore, at the receiver the reverse process of the transmitter is implemented. Further, transmit antenna diversity schemes are used to improve the OFDM system reliability. Such transmit diversity schemes in OFDM systems are encoded in the frequency-domain as described.

MIMO has been selected as the basis for the high speed wireless local area network (WLAN) standards by the IEEE standardization group. FIG. 1 shows a MIMO system splits the data before convolutional encoding. The system in FIG. 1 includes a OFDM MIMO transmitter 100 implementing WLAN, comprising a source of data bits 102, a spatial parser 104, and multiple data stream processing paths 106. Each data stream processing path 106 comprises: a channel encoder & puncturer 108, a frequency interleaver 110, a constellation mapper 112, an IFFT function 114, a guard-band insertion GI window 116 and an RF modulator 118.

The system diagram in FIG. 1 represents a MIMO OFDM structure for 20 MHz channelization, and uses two independent convolutional-code encoders for the two data paths. Further, two IEEE 802.11a interleavers are used independently, each interleaver 110 corresponding to each encoder. An interleaver 110 in FIG. 1 provides an optimal design for single antenna systems by fully exploring the frequency diversity. However, for multiple antenna systems, this design does not explore the spatial diversity brought in by the multiple antennas. Thus, there is a need for an interleaver design to fully explore the diversity of the MIMO OFDM systems.

BRIEF SUMMARY OF THE INVENTION

The present invention provides an improved interleaver design to fully explore the diversity of the MIMO OFDM systems. An interleaver according to the present invention provides higher diversity gain than usual. Such an interleaver provides column swap and bit circulation for multiple forward error code encoder MIMO OFDM systems. Accordingly, in one embodiment the present invention provides a system and method for wireless data communication, implementing the steps of: parsing a bit stream into multiple spatial data streams; interleaving the bits in each spatial data stream by performing bit circulation to increase diversity of the wireless system; and transmitting the bits of each spatial data stream. The steps of interleaving the bits in each spatial data stream further include the steps of performing column swapping.

In one example, the steps of interleaving the bits include the steps of splitting the bits in each data stream into multiple groups corresponding to subcarriers in a transmission symbol, performing a column swap operation on the subcarriers, circulating the bits among the groups, and combining the bits for the different data streams to form a new bit sequence for transmission.

In another embodiment, the steps of interleaving the bits in each spatial data stream further includes the steps of performing column swapping within an interleaving array of that spatial data stream, to increase diversity of the wireless system. The steps of interleaving the bits can further include the steps of splitting the bits in each data stream into multiple groups corresponding to subcarriers in a transmission symbol, performing column swapping within an interleaving array of that spatial data stream, circulating the bits among the groups, and combining the bits for the different data streams to form a new bit sequence for transmission. The steps of interleaving the bits in each spatial data stream includes the steps of, before circulation, performing a first interleaving permutation for column swapping wherein the stream data bits are written in by row, read out by column.

These and other features, aspects and advantages of the present invention will become understood with reference to the following description, appended claims and accompanying figures.

DETAILED DESCRIPTION OF THE INVENTION

In one embodiment, the present invention provides an improved method interleaving for a MIMO system that implements the IEEE WLAN standard. The interleaving method improves exploration of the diversity of an MIMO OFDM system, providing higher diversity gain than usual.

Figure 1:
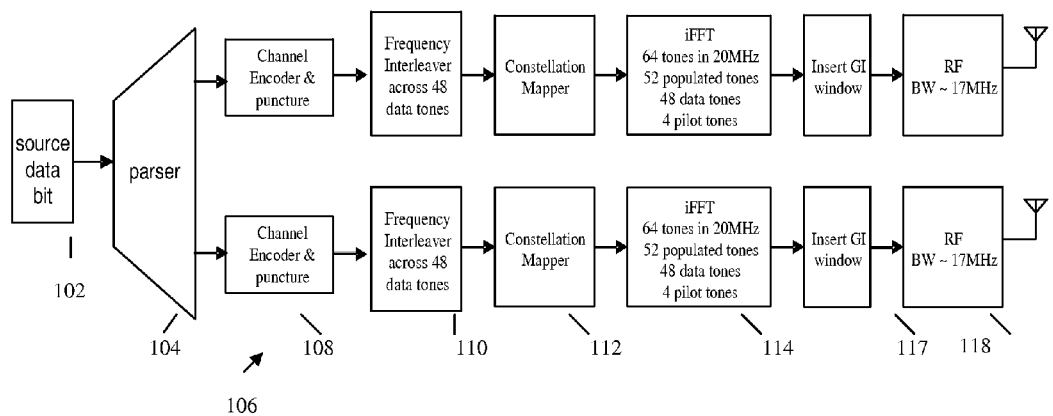
FIG. 1 shows a block diagram of a MIMO OFDM transmitter.
Figure 2:
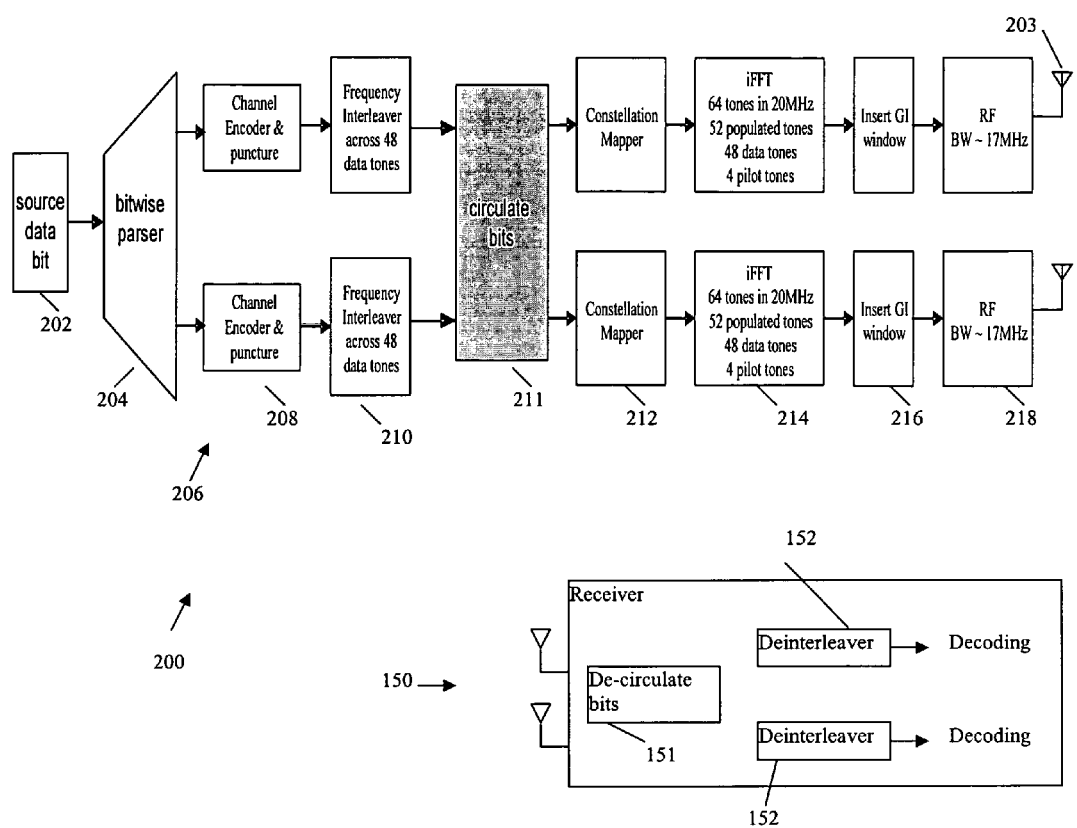
FIG. 2 shows an example block diagram of an embodiment of a MIMO OFDM transmitter according to an embodiment of the present invention.

FIG. 2 shows a block diagram of an example OFDM MIMO transmitter 200 of a MIMO system, wherein the transmitter 200 implements an embodiment of the improved interleaving method according to the present invention. The transmitter 200 comprises: a source of data bits 202, a bitwise spatial parser 204, and multiple data stream processing paths 206 (e.g., two paths for two antennas 203). Each data stream processing path 206 corresponds to a transmit antenna 203, and comprises: a channel encoder & puncturer 208, a frequency interleaver 210, a constellation mapper 212, an IFFT function 214, a guard-band insertion GI window 216 and an RF modulator 218. Each data stream processing path 206 further includes a bit circulation function 211, connected between the interleaver 210 and the constellation mapper 212, described further below.

FIG. 2 further shows a receiver 150 corresponding to the transmitter 200, forming a MIMO system. The receiver 150 includes a bit de-circulation unit 151 that performs the reverse operation of bit circulation unit 211, and deinterleavers 152 that perform the reverse operation of the interleavers 210 in the transmitter 200.

In this embodiment, the interleavers 210 provide column swap and the bit circulation unit 211 provides bit circulation for bits circulation/rotation among different spatial streams to incorporate the spatial diversity into one data stream.

Figure 3:
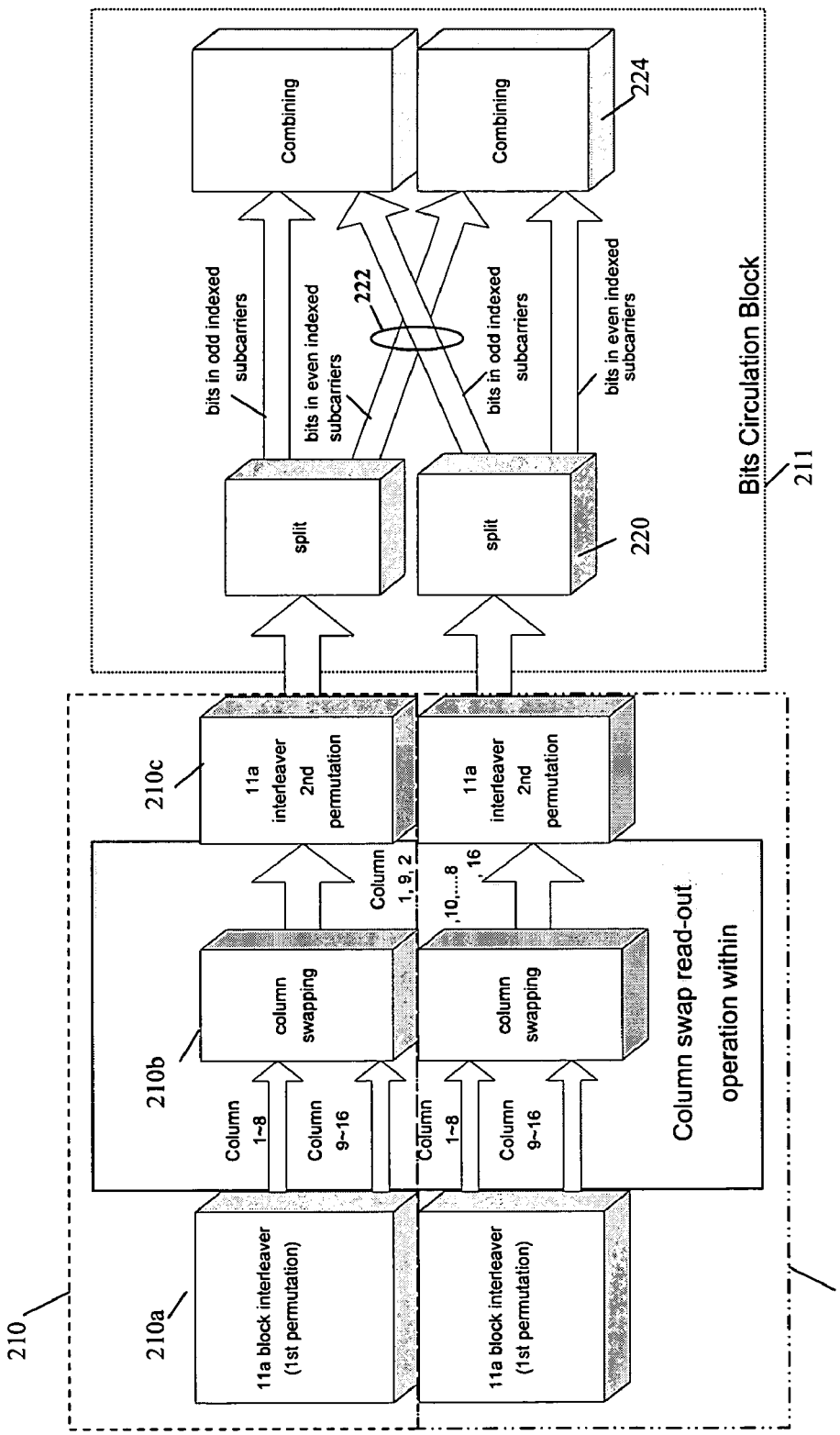
FIG. 3 shows an example block diagram of details of interleaving in FIG. 2

FIG. 3 shows an example block diagram of an embodiment of interleaving by column swap (i.e., column skip) and bit circulation using the interleaver 210 and the bit circulation unit 211, respectively. In this embodiment, the interleaving method incorporates a column skip operation, as follows. In each interleaver 210, in a first permutation 210a, the bits are written in by row, read out by column. This includes a column skip operation. After the data bits are written in block, instead of reading out the bits from column 0 1 2 3 . . . , the bits from columns 0, k, 1, k+1, 2, k+2, . . . or k, 0, k+1, 1, k+2, 2, . . . , are read out, where k is a number selected as the column-skip (i.e., columns swap operation 310b).

In the following example, k is set to 8, which is the middle column of the block interleaver. On both transmit (Tx) data path streams the write-in input bit indices are:

example, in a BPSK modulated OFDM system, each subcarrier carries 1 bit and the bit-splitting will look like the following:

Group 1: 1 3 5 7 9 . . . 47

Group 2: 2 4 6 8 10 . . . 48

Further, in a 64 QAM modulated OFDM system, where each subcarrier carries 6 bits, the bit-splitting will look like the following:

Group 1: 1 2 3 4 5 6; 13 14 15 16 17 18; . . .    277 278 279 280 281 282
Group 2: 7 8 9 10 11 12; 19 20 21 22 23 24; . . . 283 284 285 286 287 288

The bit circulator 222 for each data stream processing path 206 exchanges the bits in Group 2 for the first spatial stream with Group 1 for the second spatial stream. The combiner 224 for each data stream processing path 206 combines the bits for different spatial streams to form a new bit sequence for transmission. In another example, the bits in group 2 of both streams are exchanged as well.

Simulation has been conducted to verify the performance of the interleaving method of FIG. 3 for 20 MHz channelization. Simulation results verify the improved performance of a MIMO system implementing an interleaving method described above (e.g., FIGS. 2-3 for 20 MHz channelization). The coding and modulation set (MCS) for an example simulation is listed in Table 1 below. MCS14 uses 64 QAM, rate 3/4 convolutional code (133, 171). (IEEE 802.11 document #11-04-0889-02-000n, "TGn Sync Proposal Technical Specification," January 2005, incorporated herein by reference.)

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| 16 | 17 | 18 | 19 | 20 | 21 | 22 | 23 | 24 | 25 | 26 | 27 | 28 | 29 | 30 | 31 |
| 32 | 33 | 34 | 35 | 36 | 37 | 38 | 39 | 40 | 41 | 42 | 43 | 44 | 45 | 46 | 47 |

The read-out bits indices are:

0 16 32    8 24 40    1 17 33    9 25 42
7 23 39    15 31 47

In a second permutation 210c, PAM (Pulse Amplitude Modulation) order rotation as described in IEEE 802.11a standard is performed. PAM is a one dimensional modulation with the change of amplitude. A QAM modulation can be viewed as two PAM modulations. One is in-phase (I), the other is quadrature (Q).

The bit circulation unit 211 includes, for each data stream path 206: a splitter 220, a bit circulator 222, and a combiner 224. In the bit circulation unit 211 of FIG. 3, in each splitter 220 the output bits of the corresponding IEEE 802.11a interleaver 210 are split into two groups. One group (Group 1) corresponds to the bits in the odd index subcarriers in an OFDM symbol. The other group (Group 2) corresponds to the bits in the even index subcarriers in an OFDM symbol. For

TABLE 1

| Symbol | Number of spatial streams | Modulation | Coding rate |
|--------|---------------------------|------------|-------------|
| MCS14 | 2 | 64-QAM | 3/4 |
| MCS13 | 2 | 64-QAM | 2/3 |
| MCS11 | 2 | 16-QAM | 1/2 |

Figure 4A:
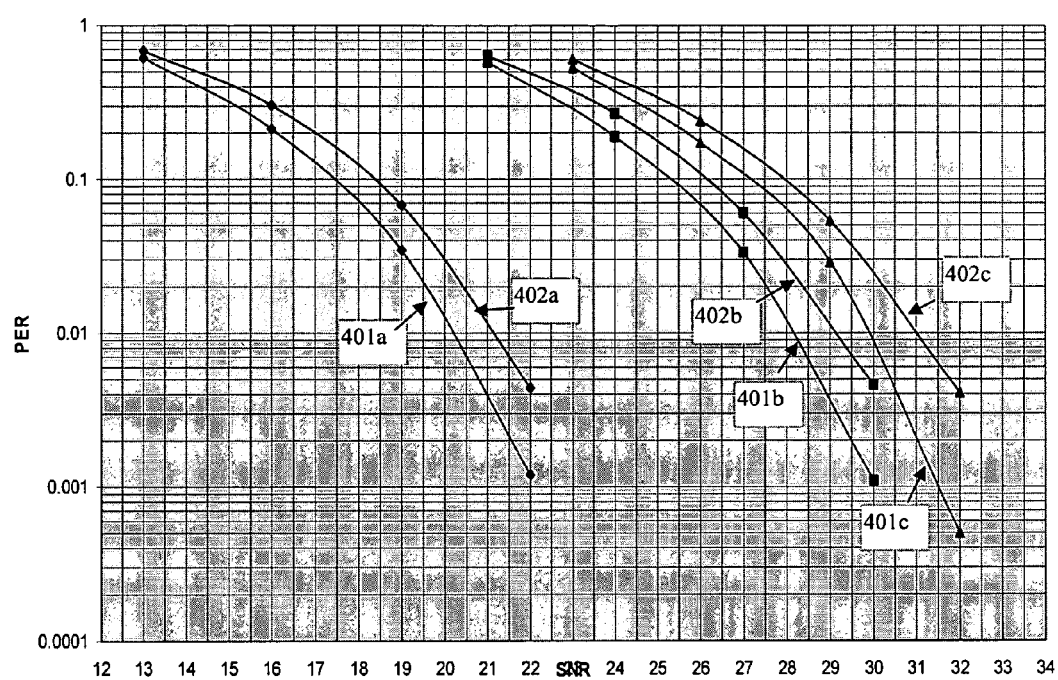
FIGS. 4A-C show example simulation results in a 20 MHz channel using a transmitter according to FIG. 2.
Figure 4B:
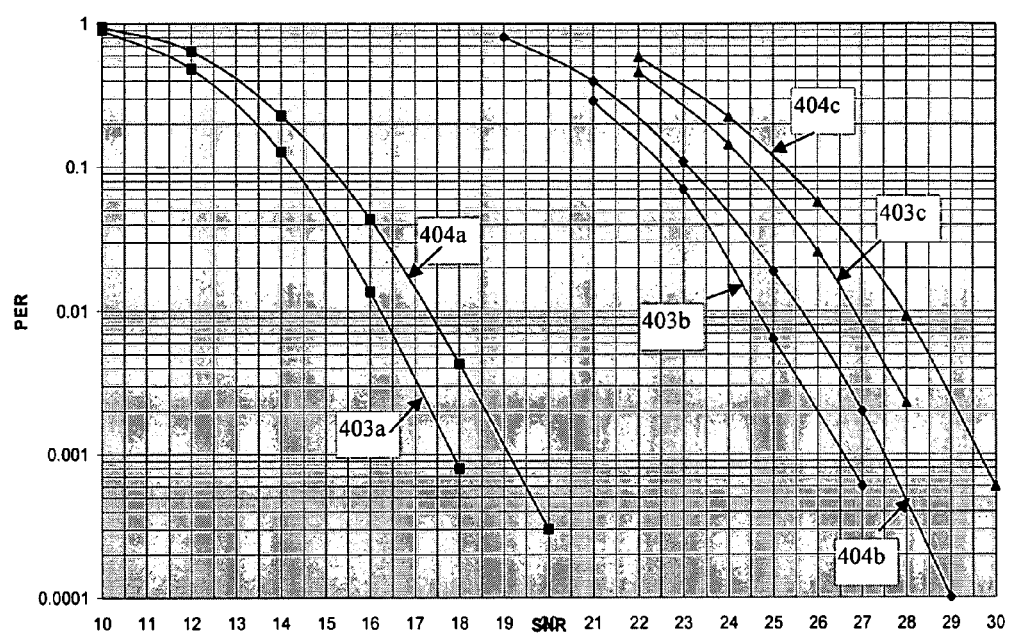
Figure 4C:
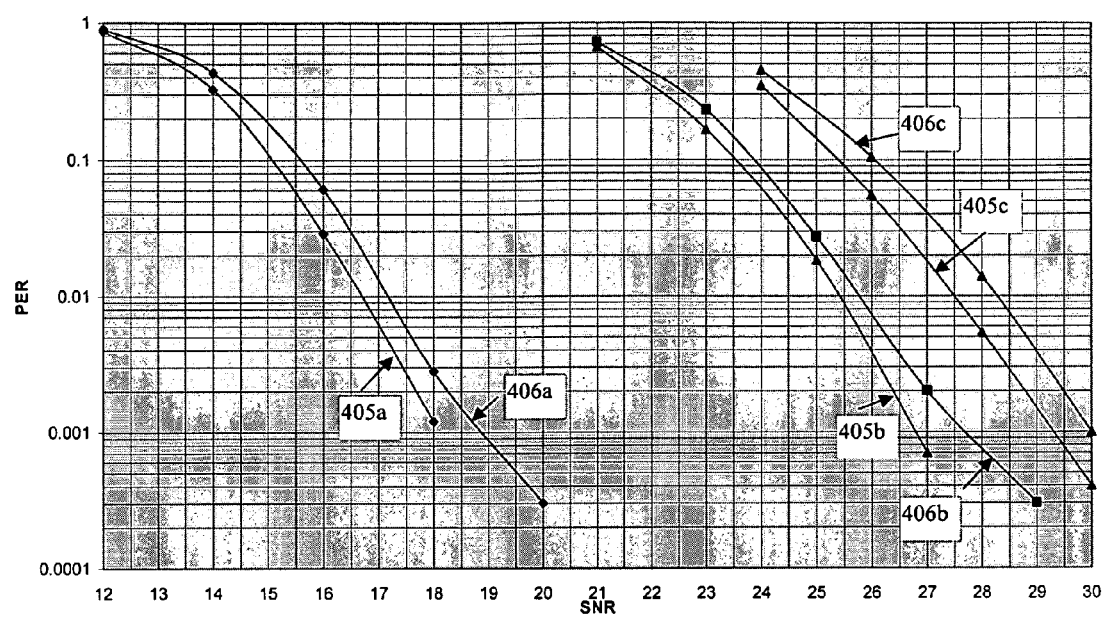

FIGS. 4A-C shows example simulation results. All simulation settings and parameters are the same as in Table 1 above.

Specifically FIG. 4A shows an example of the performance improvement with column swap and bit circulation. The simulations were conducted under IEEE 802.11n Channel model B. MCS11/13/14 were simulated. The example curves 401a, 401b and 401c correspond to MCS11, MCS 13 and MCS14 simulations, respectively, and represent the Packet Error Rate (PER) vs. SNR performance with the column swap and bit circulation operation of the present invention. The curves 402a, 402b, and 402c also correspond to MCS11, MCS 13 and MCS14 simulations, respectively, and represent the PER vs. SNR performance of the system without the column swap and bit circulation operation. The curves in FIG. 4A illustrate that for different MCS modes, the performance improvement according to an embodiment of the present invention ranges from 0.5 to 1 dB at PER level of $10^{-2}$.

FIG. 4B shows another example of the performance improvement with column swap and bit circulation. The simulations were conducted under IEEE 802.11n Channel model D. MCS11/13/14 were simulated. The example curves 403a, 403b and 403c correspond to MCS11, MCS 13 and MCS14 simulations, respectively, and represent the Packet Error Rate (PER) vs. SNR performance with the column swap and bit circulation operation of the present invention. The curves 404a, 404b, and 404c also correspond to MCS11, MCS 13 and MCS14 simulations, respectively, and represent the PER vs. SNR performance of the system without the column swap and bit circulation operation. The curves in FIG. 4B illustrate that for different MCS modes, the performance improvement according to an embodiment of the present invention ranges from 0.5 to 1 dB at PER level of $10^{-2}$.

FIG. 4C shows another example of the performance improvement with column swap and bit circulation. The simulations were conducted under IEEE 802.11n Channel model E. MCS11/13/14 were simulated. The example curves 405a, 405b and 405c correspond to MCS11, MCS 13 and MCS14 simulations, respectively, and represent the Packet Error Rate (PER) vs. SNR performance with the column swap and bit circulation operation of the present invention. The curves 406a, 406b, and 406c also correspond to MCS11, MCS 13 and MCS14 simulations, respectively, and represent the PER vs. SNR performance of the system without the column swap and bit circulation operation. The curves in FIG. 4C illustrate that for different MCS modes, the performance improvement according to an embodiment of the present invention ranges from 0.5 to 1 dB at PER level of $10^{-2}$.

The above example interleaving implementations according to the present invention provide e.g. about 0.5 to 1 dB gain over usual interleaving methods. Although the description herein is based on two data streams in a two-antenna system, as those skilled in the art will recognize, the present invention is not limited to a specific number of transmission data streams and transmission antennas. With N transmission data streams, each stream can be split into N sub-streams for bit circulation. The optimal flip method would depend on N, but using the same principle as described in the examples above. The optimal swap number also depends on N, but using the same principle as described in the examples above.

The present invention has been described in considerable detail with reference to certain preferred versions thereof; however, other versions are possible. Therefore, the spirit and scope of the appended claims should not be limited to the description of the preferred versions contained herein.

What is claimed is:

1. A method of data communication in a wireless system, comprising:
    employing a transmitter for:
    parsing a bit stream into multiple spatial data streams;
    interleaving bits in each spatial data stream by performing a first interleaving permutation and a second interleaving permutation, the first interleaving permutation including:
    column swapping within an interleaving array of that spatial data stream, to increase diversity of the wireless system, wherein column swapping further includes at least one column skip operation wherein the bits are read out in an order of k, 0, k+1, 1, k+2, k+n, n, where k is a positive integer selected as the column skip and n is a positive integer; and
    the second interleaving permutation including:
    circulating the bits among multiple groups corresponding to sub-carriers in a transmission symbol;
    splitting the bits in each data stream into multiple groups corresponding to sub-carriers in the transmission symbol;
    combining the bits for the different data streams to form a new bit sequence for transmission; and
    transmitting the bits of each spatial data stream.

2. The method of claim 1 wherein the column swapping is performed on the sub-carriers.

3. The method of claim 1 wherein interleaving the bits in each spatial data stream includes before circulation, performing the first interleaving permutation for column swapping wherein the stream data bits are written in by row, read out by column.

4. The method of claim 1 wherein the number of column swaps is a function of the number of the total spatial data streams and the number of columns in the interleaver array.

5. The method of claim 1 wherein the wireless system comprises an OFDM MIMO system.

6. A wireless communication system, comprising:
    a transmitter including:
    a parser that parses a bit stream into multiple spatial data streams;
    multiple interleavers corresponding to the multiple spatial data streams, wherein an interleaver interleaves bits in the corresponding spatial data stream by performing first interleaving permutation and a second interleaving permutation, the first interleaving permutation including:
    column swapping within an interleaving array of that spatial data stream, to increase diversity of the wireless system, wherein column swapping further includes at least one column skip operation wherein the bits are read out in an order of 0, k, 1, k+1, 2, k+3, n, k+n, wherein k is a positive integer selected as the column skip and n is a positive integer; and
    the second interleaving permutation including:
    circulating the bits in each data stream among multiple groups corresponding to sub-carriers in a transmission symbol by a bit circulation unit wherein the bit circulation unit including:
    a splitter for splitting the bits in each data stream into multiple groups corresponding to sub-carriers in a transmission symbol, to increase diversity of the wireless system;
    a circulator for circulating the bits among the groups; and
    a combiner combining the bits for the different data streams to form a new bit sequence for transmission; and
    a modulator that transmits the bits of each spatial data stream.

7. The system of claim 6 wherein the interleaver further performs column swapping within an interleaving array of that spatial data stream, to increase diversity of the wireless system.

8. The system of claim 7 wherein interleaving the bits in each spatial data stream includes, before circulation, the interleaver performing the first interleaving permutation for column swapping wherein the stream data bits are written in by row, read out by column.

9. The system of claim 8 wherein the interleaver further performs a second interleaving permutation to preserve PAM order.

10. The system of claim 7 wherein the number of column swaps is a function of the number of the total spatial data streams and the number of columns in the interleaver array.

11. The system of claim 6 wherein the wireless system comprises an OFDM MIMO system.

12. A method of data communication in a wireless system, comprising:

employing a transmitter for:

parsing a bit stream into multiple spatial data streams;

interleaving bits in each spatial data stream by performing a first interleaving permutation and a second interleaving permutation, the first interleaving permutation including:

column swapping within an interleaving array of that spatial data stream, to increase diversity of the wireless system, wherein column swapping further includes at least one column skip operation wherein the bits are read out in an order of 0, k, 1, k+1, 2, k+3, n, k+n, where k is a positive integer selected as the column skip and n is a positive integer; and the second interleaving permutation including:

circulating the bits among multiple groups corresponding to sub-carriers in a transmission symbol;

splitting the bits in each data stream into multiple groups corresponding to sub-carriers in the transmission symbol; and combine the bits for the different data streams to form a new bit sequence for transmission; and transmitting the bits of each spatial data stream.

13. A wireless communication system, comprising:

a transmitter including:

a parser that parses a bit stream into multiple spatial data streams;

multiple interleavers corresponding to the multiple spatial data streams, wherein an interleaver interleaves bits in the corresponding spatial data stream by performing first interleaving permutation and a second interleaving permutation, the first interleaving permutation including:

column swapping within an interleaving array of that spatial data stream, to increase diversity of the wireless system, wherein column swapping further includes at least one column skip operation wherein the bits are read out in an order of k, 0, k+1, 1, k+2, k+n, n, wherein k is a positive integer selected as the column skip and n is a positive integer; and the second interleaving permutation including:

circulating the bits in each data stream among multiple groups corresponding to sub-carriers in a transmission symbol by a bit circulation unit, wherein the bit circulation unit including:

a splitter for splitting the bits in each data stream into multiple groups corresponding to sub-carriers in a transmission symbol, to increase diversity of the wireless system;

a circulator for circulating the bits among the groups; and a combiner combining the bits for the different data streams to form a new bit sequence for transmission; and a modulator that transmits the bits of each spatial data stream.

* * * * *